(12) United States Patent
Golz et al.

(10) Patent No.: US 6,440,638 B2
(45) Date of Patent: *Aug. 27, 2002

(54) METHOD AND APPARATUS FOR RESIST PLANARIZATION

(75) Inventors: John Golz, Manassas, VA (US); Chorng-Lii Hwang; John Zhu, both of Wappingers Falls, NY (US)

(73) Assignee: International Business Machines Corp., Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 43 days.

(21) Appl. No.: 09/161,854

(22) Filed: Sep. 28, 1998

(51) Int. Cl.⁷ .................................... G03C 5/00

(52) U.S. Cl. ................ 430/313; 430/314; 430/315

(58) Field of Search .............. 430/270.1, 311, 430/313, 314, 319, 322, 323, 324, 327, 315; 372/1; 362/257; 438/427, 689, 691, 692, 697

(56) References Cited

U.S. PATENT DOCUMENTS

| | | | |
|---|---|---|---|
| 4,734,345 A | * 3/1988 | Nomura et al. | 430/1 |
| 4,756,793 A | 7/1988 | Peek | 156/640 |
| 4,994,409 A | 2/1991 | Yoon et al. | 437/164 |
| 5,077,234 A | 12/1991 | Scoopo et al. | 437/67 |
| 5,175,122 A | 12/1992 | Wang et al. | 437/67 |
| 5,246,813 A | 9/1993 | Hoshinouchi et al. | 430/296 |
| 5,306,390 A | 4/1994 | Peek | 156/659.1 |
| 5,310,626 A | 5/1994 | Fernandes et al. | 430/327 |
| 5,516,625 A | 5/1996 | McNamara et al. | 430/314 |
| 5,643,700 A | 7/1997 | Otsuka | 430/30 |
| 5,783,340 A | * 7/1998 | Farino et al. | 430/22 |
| 5,811,211 A | * 9/1998 | Tanaka et al. | 430/30 |
| 5,920,786 A | * 7/1999 | Pham et al. | 438/424 |

* cited by examiner

*Primary Examiner*—Mark F. Huff
*Assistant Examiner*—Saleha R. Mohamedulla
(74) *Attorney, Agent, or Firm*—Connolly Bove Lodge & Hutz LLP

(57) ABSTRACT

A method for planarizing a layer of photoresist on a substrate. The layer of photoresist is exposed to wavelengths of radiation that the photoresist is sensitive to. The radiation is directed at the layer of photoresist at an oblique angle with respect to a major dimension of the layer of photoresist. The photoresist is developed.

13 Claims, 4 Drawing Sheets

METHOD AND APPARATUS FOR RESIST PLANARIZATION

FIELD OF THE INVENTION

The invention relates to the method and apparatus for planarizing a layer of photoresist during semiconductor device manufacturing processes.

BACKGROUND OF THE INVENTION

Very large scale integrated circuit devices typically are manufactured on a substrate, such as a silicon wafer, by a sequence of material additions, such as low pressure chemical vapor depositions, sputtering operations, among others; material removals, such as wet etches, reactive ion etches, among others; and material modifications, such as oxidations, ion implants, among others. Typically, these physical and chemical operations interact with the entire substrate. For example, if a substrate is placed into an acid bath, the entire surface of the substrate will be etched away. In order to build very small electrically active devices on a substrate, the impact of these operations has to be confined to small, well-defined, regions.

Lithography in the context of VLSI manufacturing includes the process of patterning openings in photosensitive polymers, sometimes referred to as "photoresists" or "resists", which define small areas in which substrate material is modified by a specific operation in a sequence of processing steps.

The radiation preferably causes desired photochemical reactions to occur within the photoresist. Preferably, the photochemical reactions alter the solubility characteristics of the photoresist, thereby allowing removal of certain portions of the photoresist. Photoresists can be negative photoresist or positive photoresist materials.

A negative photoresist material is one which is capable of polymerizing and being rendered insoluble upon exposure to radiation. Accordingly, when employing a negative photoresist material, the photoresist is selectively exposed to radiation, causing polymerization to occur above those regions of the substrate which are intended to be protected during a subsequent operation. The unexposed portions of the photoresist are removed by a solvent which is inert to the polymerized portion of the photoresist. Such a solvent may be an aqueous solvent solution.

Positive photoresist material is a material that, upon exposure to radiation, is capable of being rendered soluble in a solvent in which the unexposed resist is not soluble. Accordingly, when applying a positive photoresist material the photoresist is selectively exposed to radiation, causing the reaction to occur above those portions of the substrate which are not intended to be protected during the subsequent processing period. The exposed portions of the photoresist are removed by a solvent which is not capable of dissolving the exposed portion of the resist. Such a solvent may be an aqueous solvent solution.

Selectively removing certain parts of the photoresist allows for the protection of certain areas of the substrate while exposing other areas. The remaining portions of the photoresist may be used as a mask or stencil for processing the underlying substrate. For example, the openings in the mask may allow diffusion of desired impurities through the openings into the semiconductor substrate. Other processes are known for forming devices on a substrate.

The manufacturing of VLSI chips typically involves the repeated patterning of photoresists, followed by etch, implant, deposition, or other operation, and ending with the removal of the exposed photoresist to make way for the new photoresist to be applied for another iteration of this process sequence.

Often, to help ensure uniform processing of materials, the upper surface of a layer of a material deposited on a substrate may be processed to lie in substantially only one plane. Such processes are typically referred to as planarization. One example of materials that may be planarized includes polycrystalline silicon. However, techniques utilized to "planarize" materials have not been applicable to photoresist.

SUMMARY OF THE PRESENT INVENTION

Aspects of the present invention provide a method for planarizing a layer of photoresist on a substrate. The method includes, a step of exposing the layer of photoresist to wavelengths of radiation that the photoresist is sensitive to. The radiation is directed at the layer of photoresist at an oblique angle with respect to a major dimension of the layer of photoresist. According to the method, the photoresist is then developed.

Additional aspects of the present invention provide a device for planarizing a layer of photoresist on a substrate. The device includes a radiation source for exposing the photoresist to radiation directed at the photoresist at an oblique angle with respect to a major dimension of the layer of photoresist.

Further aspects of the present invention provide a method for forming a semiconductor device. The method includes forming at least one trench in a substrate. The layer of photoresist is deposited on the substrate and in the at least one trench. Deposition of photoresist in the at least one trench results formation of recesses in an upper surface of the layer of photoresist. The layer of photoresist is exposed to wavelengths of radiation that the photoresist is sensitive to. The radiation is directed at the layer of photoresist at an oblique with respect to a major dimension of the layer of photoresist. Additionally, the radiation is directed at the layer of photoresist from a plurality of angles around the substrate. The layer of photoresist is developed, wherein after developing, the recesses are at least substantially eliminated. The photoresist is then subjected to further processing.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
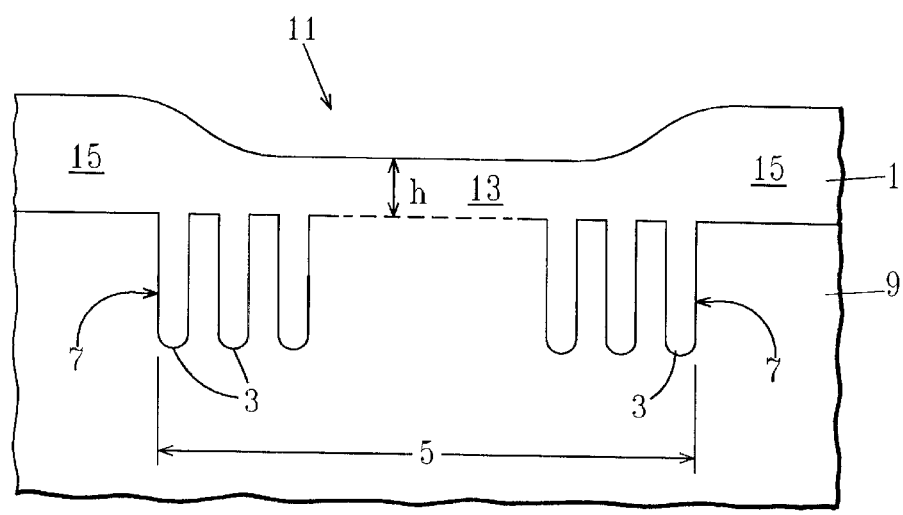
FIG. 1 represents a cross-sectional view of an example of a layer of photoresist and a portion of a substrate on which the photoresist has been deposited.

During the process of forming semiconductor devices, often, portions of a substrate are removed to make a recess for certain purposes. For example, portions of the substrate may be removed to create a trench. According to one example, deep trenches are created in a substrate during the formation of DRAM devices.

After creation of a recess, such as a deep trench, the substrate, including the recess may be covered with a layer of photoresist. Due to the deposition of material in the recess, the top surface of the layer of photoresist may be depressed in an area in the vicinity of the trench, resulting in a recess being formed in the top surface of the layer of photoresist. This problem is particularly evident when coating substrates that include high aspect ratio trenches due to the high volume consumption of resist into the trenches.

Additionally, a typical layer of photoresist can typically only be optimized to provide consistent resist thickness across the wafers on planar structures but not on top of trenches. The nonplanar profile of photoresist deposited over trenches and nonuniformity of the upper surface of a layer of photoresist across the wafers may translate down to resist recess depth and become a control problem for photoresist recess processes.

The present invention provides method and apparatus for planarizing photoresist prior to photoresist recess processes. The present invention method and apparatus for planarizing a layer of photoresist may be particularly useful for defining three dimensional structures and high aspect ratio trenches for DRAM and DRAM derivatives. Polycrystalline silicon recess processes may be applied when trenches are ready to be filled with a conducting material without requiring stripping of the polysilicon out of the trenches. However, with structures such as buried plates, vertical transistors, and collar oxide formation prior to node dielectric, trenches typically need to remain empty after the intended processes.

In these latter cases, polymer materials, such as photoresist, that can easily be stripped off without harming other portions of the structures maybe be required as recess materials.

Throughout this application, the term "resist recess" will be utilized to refer to processes carried out on a layer of photoresist utilizing stripable polymer materials. This is to be differentiated from depressions that may result in the upper layer of photoresist due to deposition of the photoresist in the trenches.

The present invention provides a method and apparatus for polymerizing photoresist. Unlike polysilicon, for which polysilicon chemical mechanical polishing (CMP) planarization processes are available for planarization prior to resist recess, only one possible alternative method for planarizing photoresist exists, and this method is not in practice, but only under study. The method utilizes CMP to planarize photoresist.

Advantages of the present invention include that it is inexpensive. Along these lines, the present invention may require only a light source and developer. Additionally, the present invention could be smoothly integrated into existing lithography coating tracks. Furthermore, the present invention is clean. On the other hand, for example, CMP produces particles and requires extra cleaning that is not necessary according to the present invention. The present invention also produces good uniformity. On the contrary, for example, CMP has an associated dishing problem at the array edge. CMP may also consume materials under the photoresist. The present invention does not result in any such material consumption. Still further, the present invention, as compared to CMP has an shorter associated raw process time, resulting in a better throughput.

A typical photoresist coating over wafers including trench structures or other recesses typically results in a top surface profile as illustrated in FIG. 1. The structure illustrated in FIG. 1 includes a layer of photoresist 1 deposited on a substrate 9. Prior to deposition of the layer photoresist 1, an array 5 has been formed in the substrate. The array illustrated in FIG. 1 includes trenches 3. The array extends to an array edge 7. Commonly, substrate 9 will be a semiconductor substrate. A common example of a semiconductor substrate is silicon. Silicon carbide is another example of a semiconductor substrate.

The layer photoresist 1 illustrated in FIG. 1 includes a depression 11 over the array 5, resulting from the consumption of photoresist by the trenches 3. As a result, over portions of the array, the layer of photoresist 1 includes a portion 13 having a reduced height h. The photoresist typically has a greater thickness in areas 15 outside of the array 5. Additionally, the height of the resist over the trench array may be difficult to control and may be nonuniform.

The thickness of the photoresist in areas 15 outside of the array may be optimized to be substantially uniform across the substrate. As a result, it will be beneficial to have a planarization process to reduce a nonplanar profile in the upper surface of the photoresist and resist height variation over trenches and across a substrate. Without a planarization step, a nonplanar upper surface of the photoresist and height variation will translate into resist recess depth nonuniformity. Nonuniformity across an entire substrate could use up the process window.

The method and apparatus of the present invention provides a simple and controllable way to planarize photoresist prior to resist recess processing. The present invention facilitates the creation of uniform resist recess profile and helps to control resist recess depth by eliminating or at least substantially reducing the effect of nonuniformity of photoresist to resist recess processing.

Figure 2:
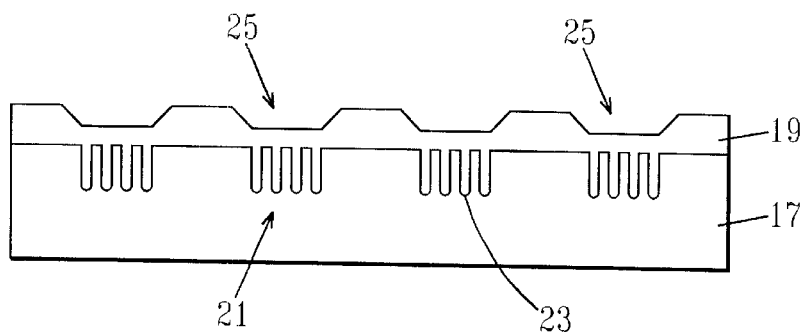
FIG. 2 represents a cross-sectional view of a larger portion of the substrate such as that shown in FIG. 1, at a similar point during the production of a semiconductor device.

FIG. 2 illustrates an example of a typical structure that the present invention may be utilized with. The structure shown in FIG. 2 includes a substrate 17 with a layer of photoresist 19 formed thereon. A plurality of arrays 21 have been formed in substrate 17. Each array 21 includes plurality of trenches 23 formed in the substrate. As a result of photoresist being deposited in the trenches as compared to on the surrounding surfaces, the layer of photoresist 19 includes a plurality of depressions 25 over the trenches.

Figure 3:
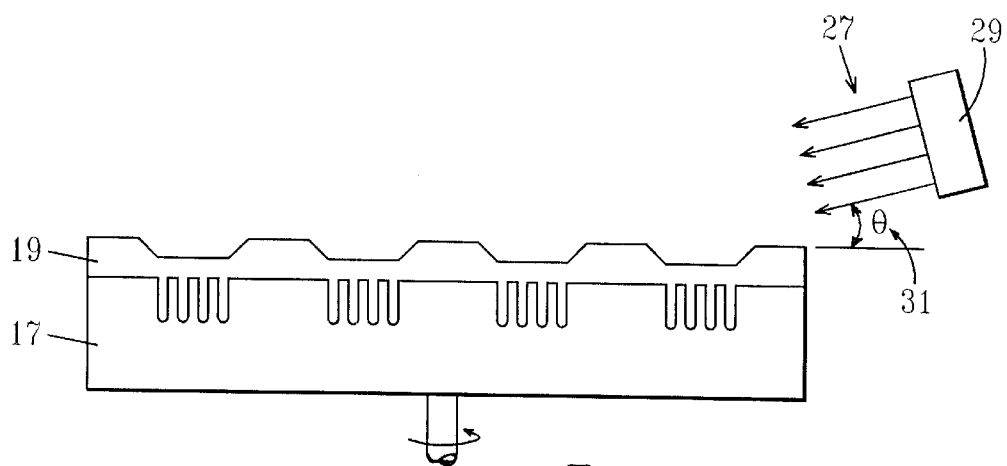
FIG. 3 represents a cross-sectional view of the portion of substrate illustrated in FIG. 2 being subjected to an embodiment of a process according to the present invention.

To planarize the photoresist, the present invention includes a method wherein the layer of photoresist is exposed to wavelengths of radiation that the photoresist is sensitive to, wherein the radiation is directed at the layer of photoresist at an oblique angle with respect to a major dimension of the layer of photoresist. In other words, the angle of the radiation is oblique with respect to most of the upper surface of the photoresist. FIG. 3 illustrates a photoresist-covered substrate undergoing an embodiment of a method according to the present invention. In the embodiment illustrated in FIG. 3, the structure is illuminated with radiation 27 produced by radiation source 29.

The radiation directed at the photoresist is angled with respect to the substrate and the layer of photoresist. The angle is measured with respect to the major dimension of the substrate and the layer of photoresist deposited thereon. In other words, the angle is measured with respect to a plane parallel to the substrate and the layer photoresist. In FIG. 3 the angle is represented by θ.

The angle 31 (θ) of the radiation with respect to the photoresist may depend upon the depth and width of the depressions 25 in the upper surface of the layer of photoresist. By exposing photoresist coated trenches to radiation at an oblique angle will cause the resist outside of the trenches to be exposed and become removable by developers. On the other hand, the resist in the depressions will not be exposed as much. Therefore, less of the resist within the trenches will be removed, thereby equalizing, or planarizing, the level of the upper surface of the photoresist.

Figure 4:
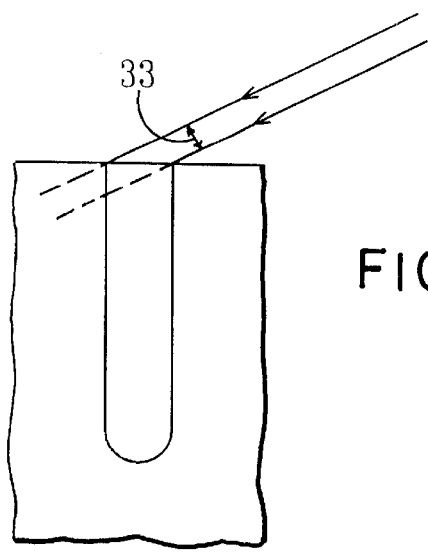
FIG. 4 illustrates a reduction in effective trench size when photoresist is exposed at an oblique angle according to an embodiment of a process of the present invention.

FIG. 4 illustrates the principle upon which the present invention operates. By illuminating the photoresist covered trenches at an oblique angle, the effective size 33 of the trench opening is reduced. As illustrated in FIG. 4, on edge of depressions in the photoresist may at least partially shade portions of the resist in the depressions over the trenches from being exposed to the radiation at an oblique angle. According to the present invention, the depth of depressions in the upper surface of the photoresist maybe expected to be reduced tremendously.

On the other hand, if the photoresist in the trenches were exposed to light surfaces directed vertically down, the resist in the trench as well as the resist outside the trench would be exposed by the radiation and become removable by developers. As a result, the photoresist would still be recessed in the trenches. The present invention solves this problem by illuminating the resist at an angle.

Various parameters relating to the exposure of the photoresist may be varied, depending upon the application. For example, the time of the exposure may be varied. The angle of the radiation with respect to the photoresist may also be varied. Typically, the angle of the radiation with respect to the photoresist is less than about 45°. However, the angle may be as low as necessary to result in the desired degree of planarization. The angle may depend upon the size of depressions in the photoresist surface, which may in turn depend upon the trench size. The exposure dose may be optimized to minimize the recess into the trenches.

Figure 7:
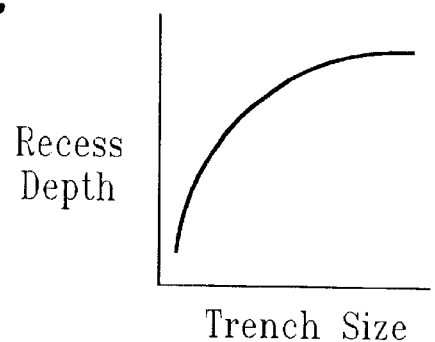
FIG. 7 represents a graph illustrating a relationship between the depth of recesses in the layer of photoresist with respect to depth of trenches formed in the substrate over which the layer of photoresist has been deposited.
Figure 8:
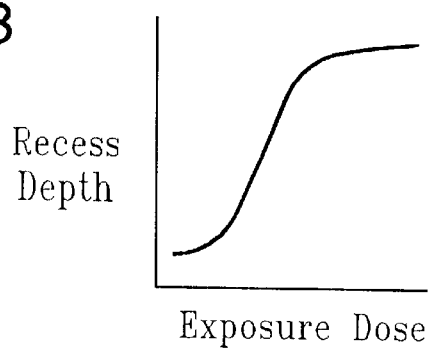
FIG. 8 represents a graph illustrating a relationship between the depth of the recesses in the layer of photoresist and a required exposure dose according to an embodiment of a process according to the present invention.

Depth of depressions in the photoresist maybe affected by a plurality of factors. Among these factors maybe trench size, wavelength of radiation utilized and optical dose. FIGS. 7 and 8 illustrate a relationship between the depth of depressions formed in the upper surface of the layer of photoresist with respect to trench size and exposure dose, respectively. As illustrated in FIG. 7, depth of the depressions in the photoresist may increase as the size of the trenches increases. For example, the depth of the depressions may increase as depth of the trenches increases. The processes, results of which are illustrated in FIG. 7, included fixed dose and wavelength of radiation.

FIG. 8 illustrates the relationship between the depth of depressions in the photoresist and exposure dose. As can be seen, the longer the exposure dose, the greater the depth. However, just as with trench size, depth dose, level off at some point such that with increased dosage or trench size depth of the recess will only increase slightly.

To increase the uniformity of the exposure of the photoresist and portions of the side walls of the depressions in the photoresist that may be exposed by the angled radiation, the radiation preferably maybe directed from various angles around the substrate. To accomplish this, the substrate can be rotated as it is being exposed to the radiation at an oblique angle. Alternatively, the radiation source may be rotated around the substrate. Furthermore, both the substrate and the radiation source could be rotated. According to another embodiment, the plurality of radiation sources are arranged about the substrate. According to a still further embodiment, a circular radiation source is utilized to expose the photoresist. One or more radiation sources could also be rotated around the substrate.

Figure 9:
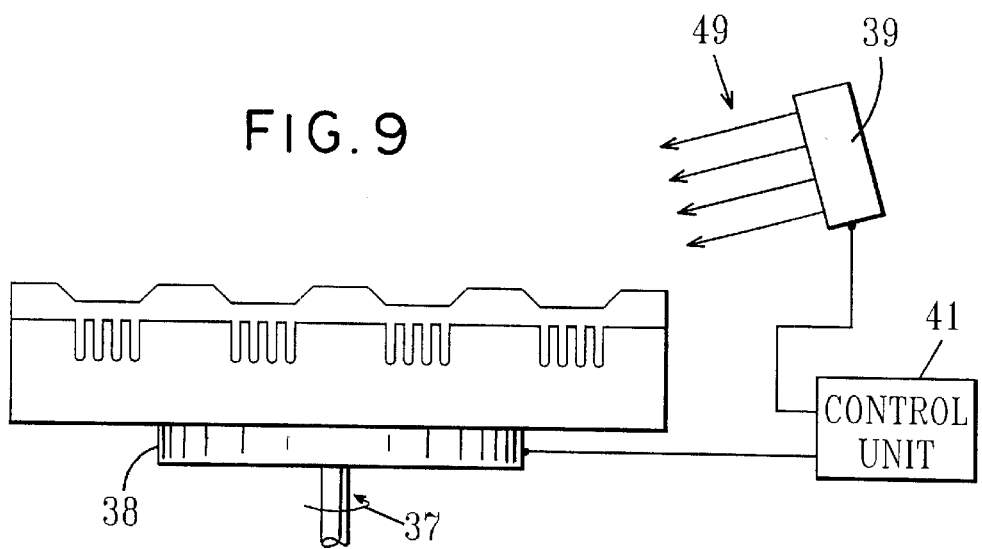
FIG. 9 represents an embodiment of an apparatus according the present invention shown carrying out a process according to an embodiment of the present invention.

FIG. 9 illustrates an embodiment of an apparatus according to the present invention that includes a rotating substrate support 38. The rotation is indicated by arrow 37. The apparatus shown in FIG. 9 includes a radiation source 39. Both the substrate and the radiation source are controlled by control unit 41.

Figure 10:
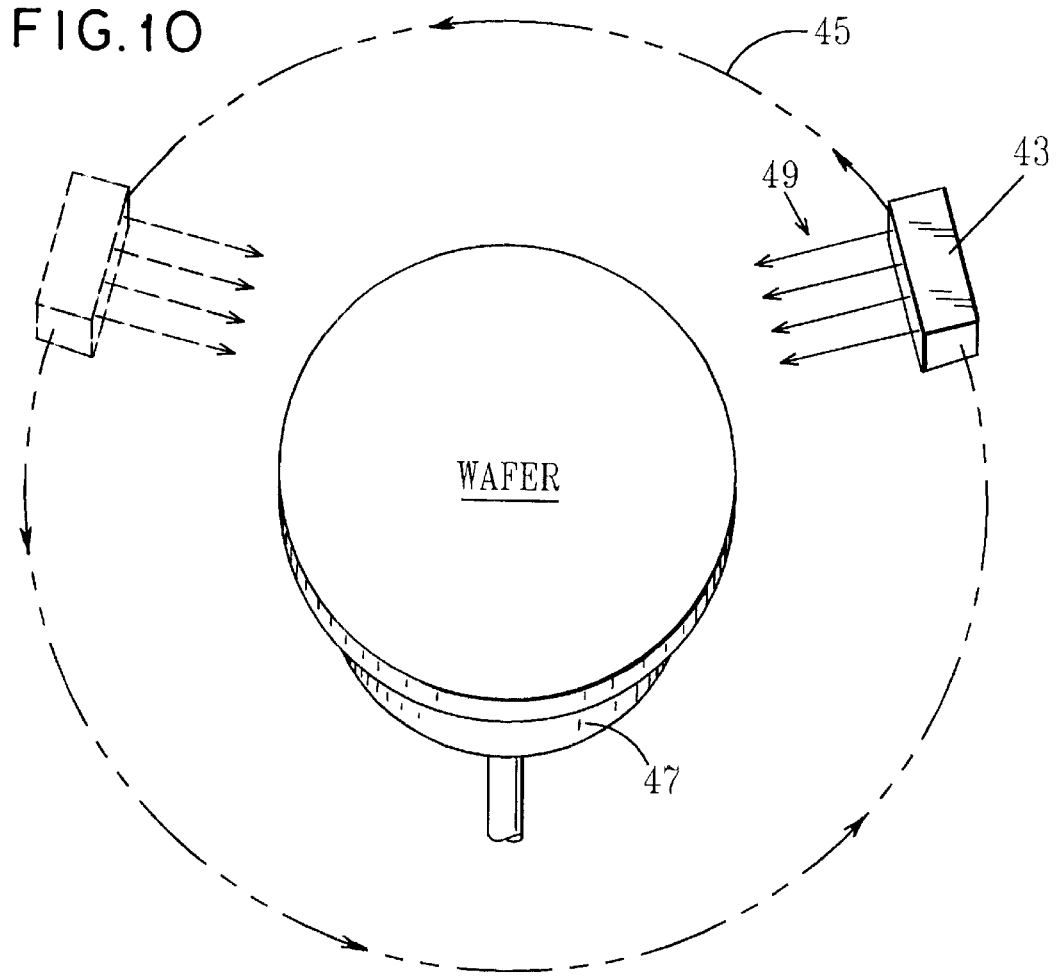
FIG. 10 represents another embodiment of an apparatus according to the present invention.

FIG. 10 illustrates an embodiment of an apparatus according to the present invention that includes a rotating radiation source 43 and a stationary substrate support 47. The passage of the radiation source is indicated by the broken line 45 in FIG. 10. The embodiment shown in FIG. 10 also includes a control unit (not shown). In embodiments where a substrate and/or a single radiation source are rotated, the periodicity of rotation of the substrate and the radiation source with respect to each other maybe less than the inverse of a time that the photoresist is exposed to the radiation.

Figure 11:
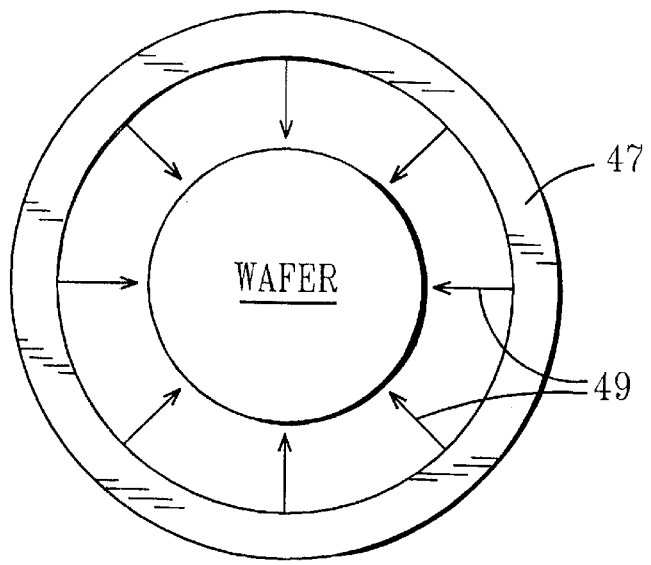
FIG. 11 represents a further embodiment of an apparatus according to the present invention.

FIG. 11 illustrates an embodiment of an apparatus according to the present invention that includes a radiation source 47 that entirely surrounds the substrate being exposed. In all of FIGS. 9–11, the path of the radiation is indicated by arrows 49.

Figure 5:
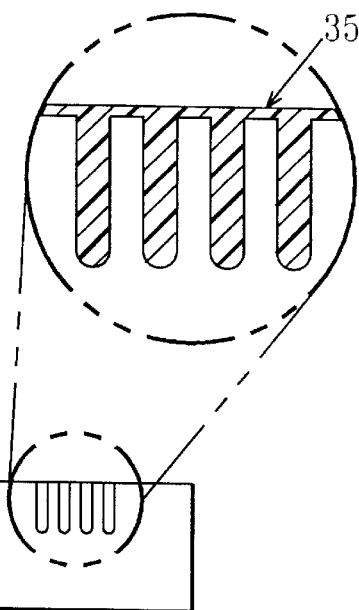
FIG. 5 represents a cross-sectional view of the portion of the substrate illustrated in FIG. 3 after undergoing an embodiment of a process according to the present invention.
Figure 5:
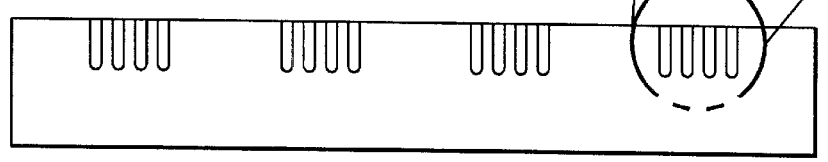
Figure 6:
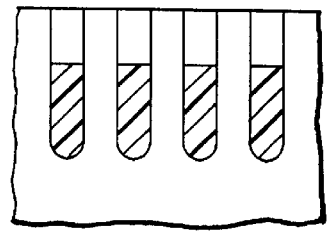
FIG. 6 represents a cross-sectional view of a portion of the substrate illustrated in FIGS. 2, 3, and 5 after being subjected to further processing of the photoresist.

After exposure of the photoresist to radiation directed at an oblique angle, the photoresist maybe developed according to standard procedures for developing the photoresist. FIG. 5 illustrates an example of a layer of photoresist that has been planarized according to the present invention. As illustrated in FIG. 5, only very slight recess may remain in the photoresist after being subjected to a process according to the present invention. According to some embodiments, the depression may be entirely eliminated. According to typical embodiments of the present invention, depressions in the photoresist may be reduced by about 80% to about 100% as compared to their original depth. The depth of the depressions may also be of non-uniform depth as compoared to each other and among different samples treated according to the present invention.

After the undergoing the above-described planarization process, the photoresist may be processed according to resist recess processes, such as chemical downstream etch and isotropic developer etch, among others.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for fabricating a photoresist plug having controlled vertical dimensions within a trench, said method comprising the steps of:
   providing a substrate having at least one trench formed therein;
   providing a layer of photoresist over said substrate, said photoresist filling said at least one trench;
   exposing said layer of photoresist to wavelengths of radiation to which said photoresist is sensitive, wherein said photoresist in said at least one trench is exposed to a controlled depth, wherein said radiation is directed at said layer of photoresist at an oblique angle of incidence with respect to a major dimension of said layer of photoresist, and wherein said depth is controlled by said angle of incidence;
   developing said exposed layer of photoresist; and
   stripping said exposed layer of photoresist.

2. The method according to claim 1, wherein the at least one trench is formed in the substrate during a process of forming a DRAM cell.

3. The method according to claim 1, wherein the layer of photoresist includes at least one recess in an upper surface and wherein an edge of the recess at least partially shades portions of the recess from exposure to the radiation.

4. The method according to claim 1, further comprising the step of rotating the substrate during the exposure of the layer of photoresist to radiation.

5. The method according to claim 4, wherein the periodicity of rotation of the substrate is less than the inverse of a time that the layer of photoresist is exposed to the radiation.

6. The method according to claim 1, wherein the radiation is provided by a radiation source that simultaneously illuminates the substrate from a plurality of directions around the substrate.

7. The method according to claim 6, wherein the lradiation source surrounds the substrate.

8. The method according to claim 1, wherein the radiation is provided by a radiation source that rotates around the substrate while exposing the substrate to radiation.

9. The method according to claim 1, further comprising the step of: subjecting the photoresist to further processing.

10. The method according to claim 9, wherein the further processing includes at least one process selected from the group consisting of chemical downstream etching and isotropic developer etching.

11. The method according to claim 1, wherein the angle of the radiation with respect to the major dimension of the layer of photoresist is less than forty-five degrees.

12. The method according to claim 3, wherein a depth of the recess is less after exposing the layer of photoresist to radiation and developing the layer of photoresist as compared to the before exposing and developing.

13. A method for forming a semiconductor device, the method comprising the steps of
   forming at least one trench in a substrate;
   depositing a layer of a photoresist on the substrate and in the at least one trench, wherein said layer of photoresist deposited in the at least one trench results in formation of recesses in an upper surface of the layer of photoresist;
   exposing the layer of photoresist to wavelengths of radiation that the layer of photoresist is sensitive to, wherein the radiation is directed at the layer of photoresist at an oblique angle with respect to a major dimension of the layer of photoresist, and wherein the radiation is directed at the layer of photoresist from a plurality of angles around the substrate; developing the layer of photoresist, wherein said photoresist in said at least one trench is exposed to a controlled depth, wherein said radiation is directed at said layer of photoresist at an oblique angle of incidence with respect to a major dimension of said layer of photoresist, and wherein said depth is controlled by said angle of incidence; wherein after developing of the layer of photoresist the recesses are substantially eliminated; and
   subjecting the photoresist to further processing.

* * * * *